United States Patent [19]
Bodenstab

[11] Patent Number: 5,698,998
[45] Date of Patent: Dec. 16, 1997

[54] FAST, LOW POWER, DIFFERENTIAL SENSE AMPLIFIER

[75] Inventor: Paul R. Bodenstab, Fort Collins, Colo.

[73] Assignee: Hewlett-Packard Co., Palo Alto, Calif.

[21] Appl. No.: 635,250

[22] Filed: Apr. 12, 1996

[51] Int. Cl.[6] .................................................. G01R 19/00
[52] U.S. Cl. ............................... 327/55; 327/54; 327/52
[58] Field of Search ........................... 327/55, 57, 51–54, 327/56, 215, 222, 65; 365/208

[56] References Cited

U.S. PATENT DOCUMENTS

| | | | |
|---|---|---|---|
| 4,551,641 | 11/1985 | Pelley, III | 327/55 |
| 5,297,092 | 3/1994 | Johnson | 327/51 |
| 5,345,120 | 9/1994 | Taylor | 365/208 |
| 5,457,657 | 10/1995 | Suh | 327/51 |
| 5,479,045 | 12/1995 | Narahara et al. | 327/55 |
| 5,572,471 | 11/1996 | Proebsting | 365/208 |

OTHER PUBLICATIONS

Masanori Izumikawa, et al, A 400 MHz, 300mW, 8kb, CMOS Scram Macro with a Current Sensing Scheme, Feb. 1994 IEEE 1994 Custom Integrated Circuits Conference, pp. 595–597.

Toshinari Takayanagi, et al, 2.6 Gbvte/sec Bandwidth Cache/TLB Macro for High–Performance Risc Processor, Apr. 2, 1991, IEEE 1991 Custom Integrated Circuites Conference, pp. 10.2.1–10.2.4.

Kazuhiro Sawada, et al, A 5ns 369kbit Port–Configurable Embedded Scram with 0.5 UM CMOS Gate Array, Apr. 4, 1991, IEICE Transactions vol. E 74, pp. 929–937.

Edison H. Chiu, et al, A 50–MHz 10–ns SUBMICROM BiCMOS 2–Way Set Associative Cache Tag Memory, Apr. 2, 1991, IEEE Custom Integrated Circuits Conference, pp. 10.1.1–10.1.4.

*Primary Examiner*—Toan Tran
*Attorney, Agent, or Firm*—Alexander J. Neudeck

[57] ABSTRACT

Small voltage changes on a highly capacitive signal are sensed rapidly by placing a shielding impedance between the signal to be sensed and the input to a regenerative sense circuit. A regenerative sense circuit has a sense amplifier which controls a switching means that is connected to the input to the sense amplifier. When the output of the sense amplifier reaches a threshold value, it turns the switching means on. This switching means increases the rate of change on the input to the sense amplifier which causes the switching means to turn on even more. The input and output of the sense amplifier are able to switch more rapidly because the shielding impedance allows the switching means to change the state of the input to the sense amplifier without having to completely change the voltage level on the highly capacitive input signal. A small voltage difference between two signals is sensed by two cross-coupled, actively loaded, NMOS inverters. A regenerative effect is achieved by switching means which increase the voltage difference between the bias voltages of the NMOS inverters. The switching means are turned on when the voltage difference between the outputs of the NMOS inverters reach a threshold value. Impedances are added between the bias voltages of the NMOS inverters and the input signals so that the switching means may achieve the regenerative effect without having to completely change the voltage on the large capacitance of the signals to be sensed.

8 Claims, 3 Drawing Sheets

FAST, LOW POWER, DIFFERENTIAL SENSE AMPLIFIER

CROSS REFERENCE TO RELATED APPLICATIONS

This application is related to my application which is commonly owned, Ser. No. 08/631,100, Hewlett-Packard (HP) docket number 10951073, filed on the same day as this application, Apr. 12, 1996.

BACKGROUND OF THE INVENTION

1. Field of the Invention

The invention relates to digital integrated electronic circuits. More particularly, the invention relates to the rapid sensing of small differential voltage changes between signals which are highly capacitively loaded.

2. Statement of the Problem

The overall performance of a complex digital electronic circuit, such as a microprocessor, is often limited by the speed of the slowest electrical path within that circuit. Often, this path involves a highly capacitively loaded line which must be sensed and used to control additional logic. This scenario is found in many areas of digital logic design. For example: multiple registers that can dump to a common bus line; many RAM cells that can be dumped to a common bit line; global handshake signals that are sharable among several distinct logic blocks; match or compare lines that need to be controlled whenever a bit difference is detected in multi-bit comparisons, etc.

A technique which may be used in this situation is to precharge the highly capacitive signal or signals during one phase of a clock. Then, during the opposite phase of the clock, optionally discharge that signal. To reduce sensitivity to noise, two signals may be precharged. Then, during the opposite phase of the clock, one and only one of them is discharged. The difference in voltage between the charged and discharged signals is then sensed. This differential approach is how most random access memories sense their bit lines.

The switching means used to discharge a signal typically has an impedance that is inversely proportional to its size. Accordingly, to minimize the time required to discharge the signal, the switching means must be made very large. This increases the size of the overall circuit. Increasing the size of the circuit increases its cost and negatively impacts performance.

Typically, the number of circuits which may discharge a given signal far exceed the number of circuits used to sense that signal. For example, in a RAM there may be 1024 cells capable of dumping onto a single bit line. That bit line, however, is connected to only one sense cell. Accordingly, increasing the size of the RAM cell will cost roughly 1024 times more than a similar increase in the size of the sense cell. Furthermore, every instance of the RAM cell adds load capacitance to the bit line. A larger dump transistor increases the capacitive load each RAM cell places on the bit line. This increased capacitive load is multiplied by the number of cells connected to a bit line. In the above example, the capacitive load of the RAM cell would be multiplied by 1024 where increasing the capacitance of the sense cell would have a multiplier of one. The above reasons make it desirable to achieve performance increases through the design of the sense circuit rather than the driving circuit.

The functions of the sense circuit are: sense the level of its input signal and amplify it; drive its output signal with a low impedance; minimize the delay between the input signal and the output signal; eliminate false switching of its output due to electrical noise, and minimize power dissipation.

To minimize the delay between the input signal and the output signal, it is desirable to sense a small change in voltage on the input signal. This is because the input voltage is changing relatively slowly due to the large capacitance of the input line and the high impedance of the switching means used to discharge that line. Accordingly, it takes significantly less time for the input line to reach a small voltage change than a large voltage change. Therefore, the smaller the voltage change that the sense circuit can detect, the sooner it will be able to resolve whether its input is changing. The earlier the sense circuit detects that its input is changing, the earlier it can drive its output.

Accordingly, there is a need in the art for a sense circuit which can sense voltage differences between two digital signal lines which are highly capacitive and drive output signals with low source impedance. Such a sense circuit should be able to sense small voltage differences and minimize the delay from the sensed signals to the output signals. The sense circuit should not trigger falsely so reliable operation can be achieved. Finally, the circuit should minimize power dissipation.

SUMMARY OF THE INVENTION

A differential sense amplifier is used to sense small voltage differentials between two highly capacitive lines. A series impedance is placed between the signals to be sensed and the inputs to the differential amplifier. Complementary outputs from the differential amplifier each control switching means which can rapidly discharge one input of the differential amplifier. This gives the sense circuit a regenerative effect. The series impedances make it possible for a particular switching means to discharge the associated input to the differential amplifier more rapidly than it could discharge the larger capacitance of one of the signals to be sensed.

DETAILED DESCRIPTION OF THE PREFERRED EMBODIMENT

Figure 1:
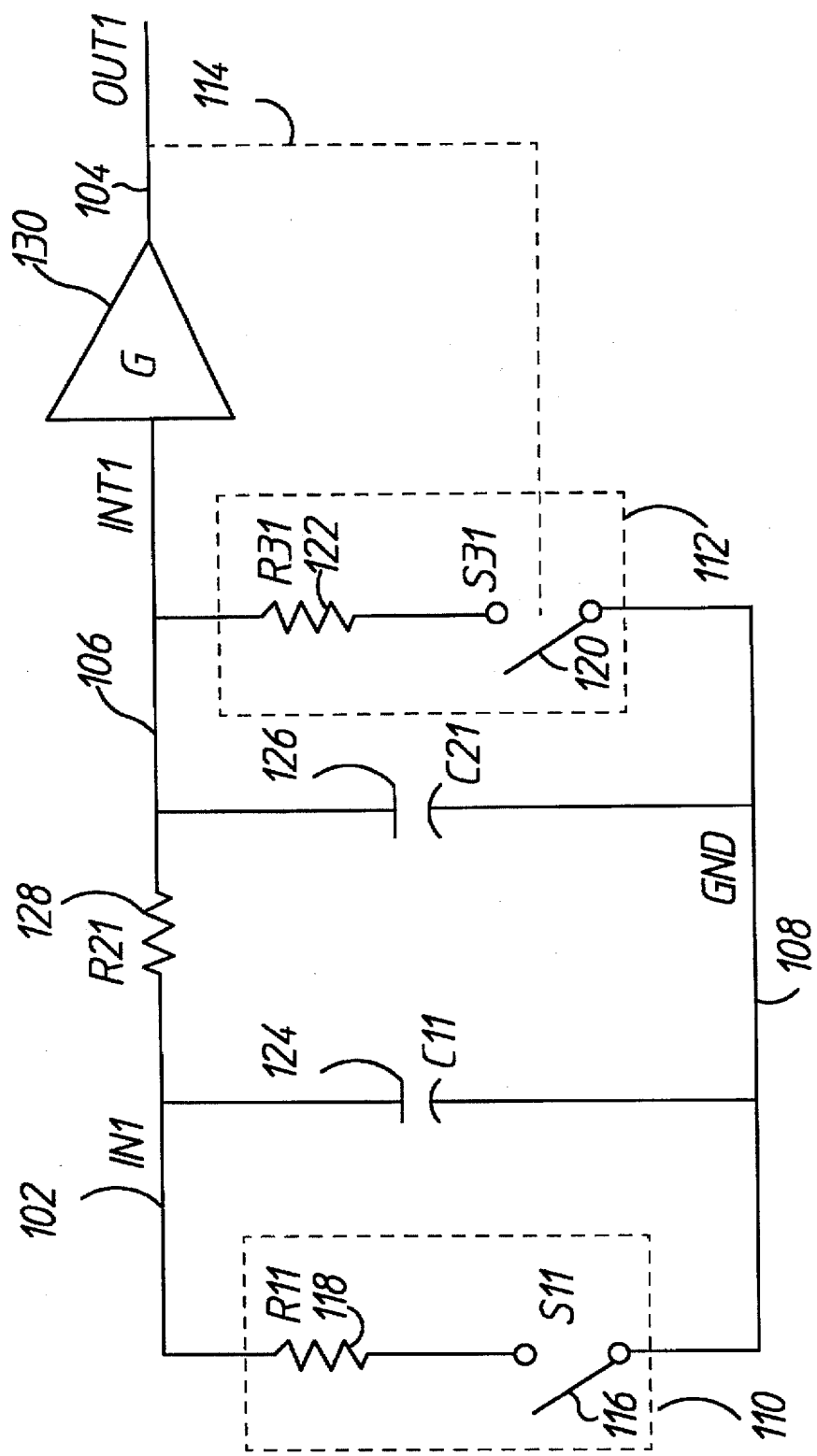
FIG. 1 is a schematic illustrating a single-ended regenerative sense circuit.

FIG. 1 illustrates a single-ended regenerative sense circuit. The signal to be sensed is labeled as node IN1 102. The output of the sense amplifier 130, is labeled OUT1 104. The input to the sense amplifier is labeled INT1 106. A common reference supply node is labeled GND 108. A switching means 110 is connected between IN1 and GND. This switching means is shown by box 110 which contains a switch S11 116 and a resistance, R11 118, in series. The resistance R11 represents the impedance of the switching means. In parallel with the switching means 110 is a capacitance C11 124. C11 represents the total of all capacitances associated with the signal to be sensed. Between nodes IN1 and INT1 is a resistance R21 128. A switching means 112 is connected between INT1 and GND. This switching means is shown by box 112 which contains a switch S31 120 and a resistance, R31 122, in series. The resistance R31 represents the impedance of the switching means. In parallel with the switching means 112 is a capacitance C21 126 C21 represents the total of all capacitances associated with node INT1. This includes, but is not limited to, the input capacitance of the sense amplifier 130. The input to the sense amplifier 130 is connected to node INT1. In addition to being the output of the sense circuit, OUT1 104, the output of the sense amplifier controls switching means 112. This is shown by dotted line 114 running from node OUT1 104 to switch S31 120. The sense amplifier 130 and the switching means 112 form a regenerative sense circuit for node INT1 106.

The signal to be sensed, IN1, is first precharged. This causes node INT1 to be precharged to the same level as IN1. The precharge level on INT1 is propagated through the sense amplifier 130. If 130 has negative gain, this forces node OUT1 to the opposite logical level as nodes IN1 and INT1. If 130 has positive gain, node OUT1 is forced to the same logical level as nodes IN1 and INT1. Switching means 112 is controlled by the level on node OUT1 to be open when node INT1 is at its precharged level.

When it is time to sense signal IN1, the means for precharging node IN1 is shut off and switching means 110 is optionally turned on. If switching means 110 is turned on, node IN1 begins to discharge. The drive impedance R11 of switching means 110 is normally smaller than the impedance chosen for R21. Also, the capacitances associated with node IN1, represented by C11, are normally much larger than the capacitances associated with node INT1 (represented by C21). Consequently, the discharge characteristics of node IN1 are controlled primarily by R11 and C11 and the level on INT1 follows the level on node IN1 after a very small delay.

Once INT1 discharges sufficiently, the amplifier 130 starts to change the level on its output node OUT1. This causes switching means 112 to begin to turn on. If the drive impedance of switching means 112, represented by R31, is less than R11 and R21, the discharge characteristic of node INT1 will be controlled primarily by R31, C21, and the gain of amplifier 130, once switching means 112 turns on. R21 makes it possible for switching means 112 to discharge the smaller capacitance of C21 through its smaller drive impedance, R31, without having to discharge C11 fully through the larger drive impedance of R11. Because C21 is much less than C11, and R31 is much less than R11, INT1 will discharge much faster than IN1. This effect will be amplified and result in the output signal OUT1 switching faster.

R21 has several positive effects on the operation of the circuit. First, R21 allows node INT1 to be discharged much faster than the combination of node IN1 and INT1 could be discharged. This improves the overall delay of the circuit which would otherwise be dependant on discharging the large capacitance of C11. Second, R21 may be physically located near switching means 112 and amplifier 130. This allows easy shielding of node INT1. R21 in conjunction with C21 creates an electrical filter which removes high frequency noise from the input node, IN1, before it reaches the input to the amplifier, node INT1. Removing high frequency noise allows amplifier 130 to be more sensitive to changes on INT1 when turning on switching means 112. This, in turn, results in a smaller threshold delay and a smaller sensing delay overall. Finally, R21 enables the drive impedance of switching means 110, R11, to be larger. Therefore, a smaller switching means 110 may be used. This results in less area being consumed by the switching circuits.

The switching means 110 and 112 in FIG. 1 may be comprised MOS transistors, bipolar transistors, or both. A single switching means 110 is shown in FIG. 1 connected to node IN1 for illustrative purposes only. There may be any number more of switching means 110 connected to node IN1. It may be that only one is turned on at a time, or several may be turned on at the same time. Amplifier 130 may be constructed from MOS transistors, bipolar transistors, or both. For example, a CMOS inverter would work as amplifier 130 and provide a negative gain coefficient. Then, an n-channel FET could be used as switching means 112. The gate of this n-channel FET would be connected to the output of the amplifier, OUT1. In this case, IN1 would be precharged to a high level forcing OUT1 low. When switching means 110 discharged node IN1 and INT1 sufficient to turn on amplifier 130, the n-channel FET would turn on and further pull down node INT1.

Figure 2:
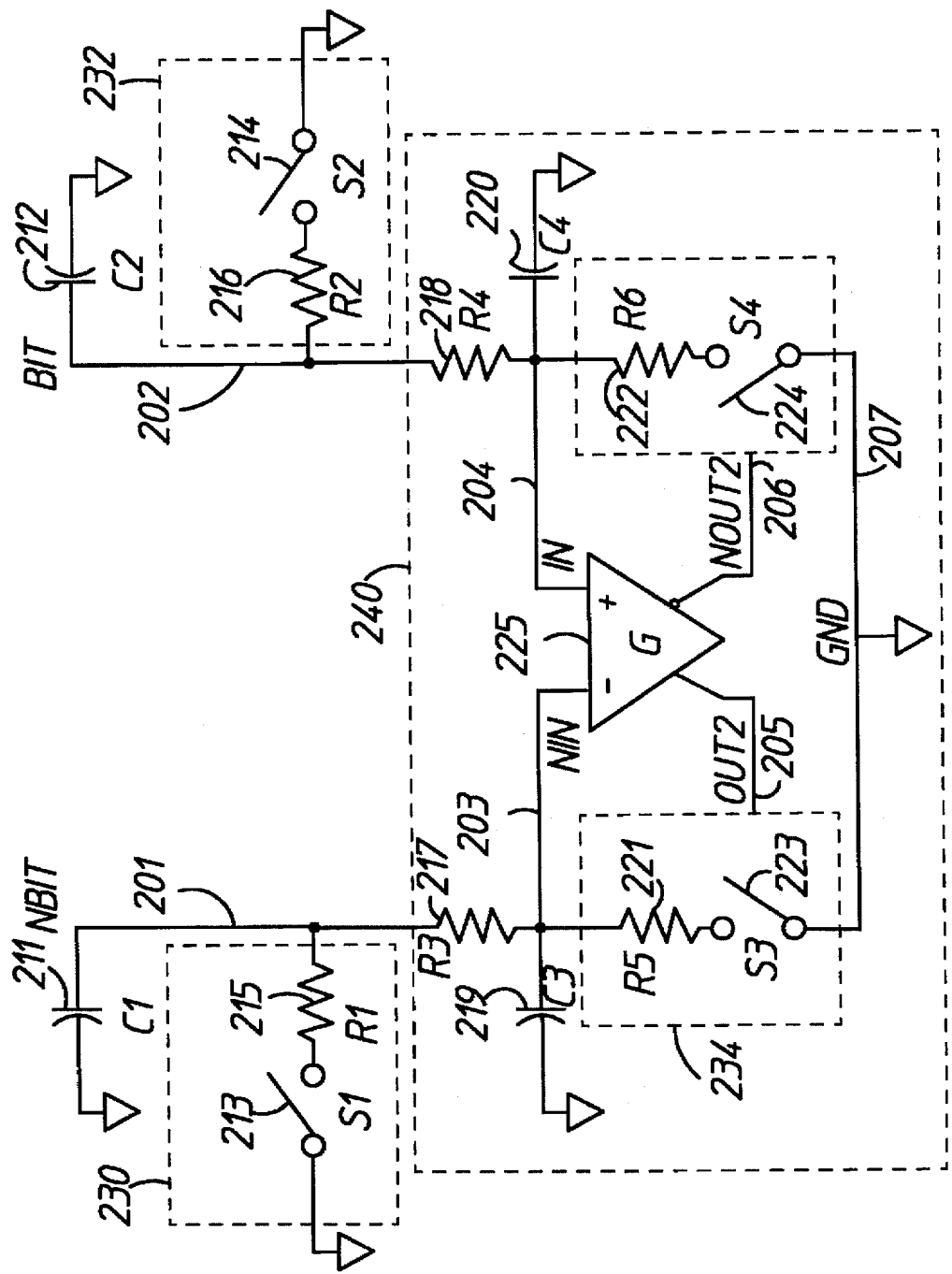
FIG. 2 is a schematic illustrating a differential regenerative sense circuit.

FIG. 2 illustrates a differential regenerative sense circuit. The signals to be sensed are labeled BIT 202 and NBIT 201. A common reference potential is labeled GND 207. Complementary outputs from the sense circuit are labeled OUT2 205 and NOUT2 206. The inverting and non-inverting outputs from a differential amplifier, 225, are connected to nodes NOUT2 and OUT2, respectively. The non-inverting input to amplifier 225 is connected to node IN 204. The inverting input to amplifier 225 is connected to node NIN 203. A capacitance, C1 211, is connected between node NBIT and GND. Likewise, a capacitance, C2 212, is connected between node BIT and GND. C1 and C2 represent the total of all capacitances associated with the signals NBIT and BIT, respectively. Switching means 230 and 232 are connected between GND and nodes NBIT and BIT, respectively. These switching means are shown by boxes 230 and 232 which both contain a switch and a resistance connected in series. Box 230 contains switch S1 213 and resistance R1 215 connected in series. The resistance R1 represents the impedance of the switching means 230. Box 232 contains switch S2 214 and resistance R2 216 connected in series. The resistance R2 represents the impedance of the switching means 232. Connected between NBIT and NIN is resistance R3 217. Connected between BIT and IN is resistance R4 218. Connected between NIN and GND is capacitance C3 219. Connected between IN and GND is capacitance C4 220. C3 and C4 represent the total of all capacitances associated with the signals NIN and IN, respectively. This includes, but is not limited to, the input capacitance of the differential amplifier 225. Switching means 234 and 236 are connected between GND and node NIN, and between GND and IN, respectively. These switching means are shown by boxes 234 and 236 which both contain a switch and a resistance connected in series. Box 234 contains switch S3 223 and resistance R5 221. The resistance R5 represents the impedance of the switching means 234. Box 236 contains switch S4 224 and resistance R6 222. The resistance R6 represents the impedance of the switching means 236. In addition to being the an output of the sense circuit, the non-inverting output of the sense amplifier, OUT2 205 controls switching means 234. This is shown by line 205 running from the non-inverting output of the differential amplifier 225 to box 234. Likewise, the inverting output of the sense amplifier 225, NOUT2 206, controls switching means 236. This is shown by line 206 running from the inverting output of the differential amplifier 225 to box 236. The sense amplifier 225 and switching means 234 and 236, form a differential regenerative sense circuit for nodes NIN and IN.

Signals BIT and NBIT are first precharged to the same level. This causes nodes IN and NIN to be precharged to the same level as BIT and NBIT. IN and NIN are now at the same level as each other so there is no voltage difference between the inputs of the differential amplifier. This propagates through the differential amplifier to force nodes OUT2 and NOUT2 to the same level. Switching means 234 and 236 are controlled by OUT2 and NOUT2 to be open when IN and NIN are at the same level.

When it is time to sense signals BIT and NBIT, the means for precharging BIT and NBIT are switched off and one of either switching means 230 or 232 is turned on. If switching means 230 is turned on, node NBIT begins to discharge. If switching means 232 is turned on, node BIT begins to discharge. The drive impedance, R1 or R2, of the switching means which is on is normally smaller than the impedance chosen for R3 and R4. Also, the capacitances associated with nodes NBIT and BIT, represented by C1 and C2, respectively, are normally much larger than the capacitances associated with nodes NIN and IN (represented by C3 and C4, respectively). Consequently, the discharge characteristics of nodes NBIT and BIT are controlled primarily by R1 and C1 or R2 and C2. The level on nodes NIN and IN closely follows the level on node NBIT or BIT, respectively, after a very small delay.

Once NIN or IN discharges sufficiently, enough of a difference exists between the inputs of the differential amplifier 225 for it to start to change the level on at least one of its outputs. One of the outputs will cause one of the switching means 234 or 236 to begin to turn on. If the drive impedances of switching means 234 and 236, represented by R5 and R6, respectively, are significantly less than R1, R2, R3, and R4, the discharge characteristics of nodes NIN and IN will be controlled primarily by the gain of the differential amplifier 225 and R5 and C3 for node NIN or R6 and C4 for node IN. R3 makes it possible for switching means 234 to discharge the smaller capacitance of C3 through its smaller drive impedance, R5, without having to discharge C1 fully through the large drive impedance of R1. R4 makes it possible for switching means 236 to discharge the smaller capacitance of C4 through its smaller drive impedance, R6, without having to discharge C2 fully through the large drive impedance of R2. Because C3 and C4 are much smaller than C1 and C2, NIN and IN can be discharged much faster than NBIT and BIT. This effect is amplified and results in the output on either NOUT2 or OUT2 switching faster.

R3 and R4 have several positive effects of the operation of the circuit. First, R3 allows node NIN to be discharged faster than the combination of nodes NBIT and NIN could otherwise be discharged. Likewise, R4 allows IN to be discharged faster than the combination of nodes BIT and IN could otherwise be discharged. This improves the delay of the circuit which would otherwise be dependant of discharging the large capacitance of either C1 or C2. Second, R3 and R4 may be physically located near switching means 234 and 236 and the differential amplifier 225. This allows easy shielding of nodes IN and NIN. Finally, R3 in combination with C3 creates an electrical filter which removes high frequency noise from node NIN. R4 in combination with C4 creates a filter which removes high frequency noise from node IN. Removing high frequency noise allows the differential amplifier 225 to be more sensitive to differences in voltage between IN and NIN when turning on switching means 234 or 236. This results in a smaller threshold delay and a small sensing delay overall.

The switching means 230, 232, 234, and 236 in FIG. 2 may be comprised MOS transistors, bipolar transistors, or both. A single switching means 230, 232 for each input line is shown in FIG. 2 connected to nodes NBIT and BIT for illustrative purposes only. There may be any number of switching means 230 connected to node NBIT and any number of switching means 232 connected to node BIT. It may be that only one is turned on at a time, or several may be turned on at the same time.

Figure 3:
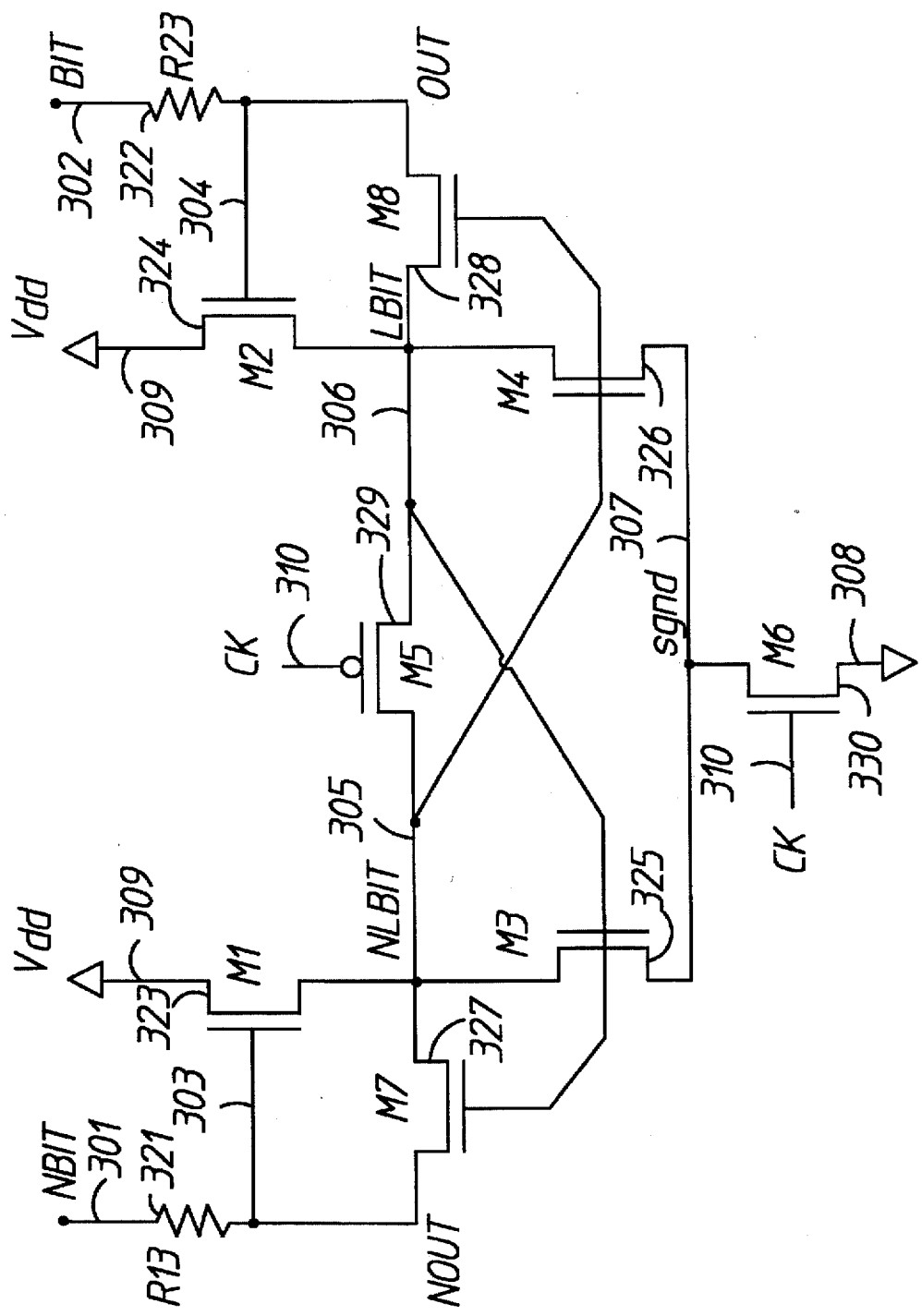
FIG. 3 is a schematic illustrating a differential regenerative sense circuit suitable for use in a CMOS integrated circuit.

FIG. 3 illustrates a circuit for implementing the portion of FIG. 2 that is contained in box 240. The inputs to the circuit are labeled NBIT 301 and BIT 302. These nodes are connected to the outputs of the circuit NOUT 303 and OUT 304 through impedances R13 321 and R23 322, respectively. Impedances R13 321 and R23 322 perform the same functions as R3 217 and R4 218 in FIG. 2. These impedances may be MOS transistors, bipolar transistors, diffused resistors, pinched resistors, epitaxial resistors, or ion-implanted resistors. R3, R4, R13, and R23 may be p-channel MOS transistors with their gates tied to the negative supply. Nodes NOUT and OUT are connected to the gate of transistors M1 323 and M2 324, respectively. The drains of M1 and M2 are both connected to the positive supply, VDD 309. The source of M1 is connected to node NLBIT 305. The source of M2 is connected to node LBIT 306. Connected between nodes NOUT and NLBIT is transistor M7 327. The gate of M7 is connected to node LBIT.

Connected between node NLBIT and node SGND 307 is transistor M3 325. The gate of M3 is connected to node LBIT. Connected between LBIT and SGND is transistor M4 326. The gate of M4 is connected to NLBIT.

Connected between nodes OUT and LBIT is transistor M8 328. The gate of M8 is connected to node NLBIT. Connected between nodes NLBIT and LBIT is transistor M5 329. The gate of M5 is connected to node CK 310 which controls M5 to be on when nodes NBIT and BIT are being precharged. Transistor M6 330 is connected between the negative supply, GND 308, and node SGND 307. The gate of M6 is connected to node CK 310 which controls M6 to be off when nodes NBIT and BIT are being precharged.

M1 and M3 form an NMOS inverter stage with an active load. Likewise, M2 and M4 also form an NMOS inverter stage with an active load. The input to these NMOS inverters is the gate to source voltage of M3 and M4, respectively. The bias voltages for the load transistors M1 and M2 is supplied by the voltages on nodes NOUT and OUT, respectively. Accordingly, when M5, M7, and M8 are off and M6 is on, the circuit may be viewed as two NMOS inverters which are cross coupled. During precharging, M5 and M6 make sure that these two NMOS inverters have equal voltages on their inputs. Since they are cross-coupled, that means their outputs are also equal. During precharging, the voltages on OUT and NOUT are equalized. This causes the gain characteristics for the two NMOS inverters to be the same. However, after precharging the nodes NOUT and OUT may change. This may alter the bias voltage for one, or both of the NMOS inverter stages. If the bias voltage for the two NMOS inverter stages change different amounts (i.e. OUT and NOUT are no longer equal) the gain characteristics of the two NMOS inverters are no longer the same. This causes one of the NMOS inverters to lower its output level which causes the other to raise its output level because they are cross-coupled. In effect, this is a differential amplifier with nodes NOUT and OUT as inputs.

When NBIT and BIT are being precharged, M5 is on and M6 is off. This allows NLBIT and LBIT to be precharged to the same level through M1 and M2. Identical levels on NLBIT and LBIT ensure that M7 and M8 are off. This keeps M7 and M8 from interfering with the precharging of NBIT, BIT, NOUT, and OUT. When it is time to sense, the precharging means and M5 are turned off and M6 is turned on. With M6 on, M1, M2, M3, and M4 form a differential amplifier. Any difference in voltage on OUT and NOUT will be amplified to create a greater difference between the voltages on NLBIT and LBIT. When the voltage difference between NLBIT and LBIT exceeds the turn on threshold of transistors M7 or M8, one (but not both) of them will turn on. The transistor that is now on starts discharging node NOUT or OUT even faster. This causes the voltage differential between NOUT and OUT to increase. The increase in this voltage difference is amplified by the differential amplifier which turns on M7 or M8 even more. This results in the discharge characteristic of NOUT or OUT being controlled by the regenerative characteristics of the amplifier and the magnitude of the small capacitance of nodes NOUT or OUT. Because of impedances R13 and R23, the discharge characteristic is minimally affected by the large capacitances on nodes NBIT or BIT. Since the switching speed of the outputs NOUT and OUT is controlled by a small capacitance, NOUT and OUT switch much faster than NBIT and BIT.

Transistor M5 is a p-channel MOS transistor when M1, M2, M3, M4, M6, M7, and M8 are all n-channel MOS transistors. The fact that the transistors of the differential amplifier, M1, M2, M3, and M4 are all of the same type makes this circuit very insensitive to process variations. Variations in the fabrication process will affect all four transistors in similar ways but the important characteristics of the differential amplifier won't change significantly.

The circuit also has low power consumption. When NBIT and BIT are not being precharged, there are no DC currents flowing in the circuit. Furthermore, once NBIT or BIT have been sensed and the regenerative action of the circuit has discharged NOUT or OUT, there are, again, no DC currents flowing in the circuit. Accordingly, there are only transient currents flowing until the amplifier is tripped. Since the sense delay is small this causes very little power dissipation.

It is to be understood that the claimed invention is not to be limited by the preferred embodiments but encompasses other modifications and alterations within the scope and spirit of the inventive concept.

What is claimed is:

1. A circuit for sensing the voltage differential between a first signal and a second signal, comprising:
   a first shield impedance between the first signal and a first output node;
   a second shield impedance between the second signal and a second output node;
   a first inverter having a first inverter output and a first gain characteristic cross coupled to a second inverter having a second inverter output and a second gain characteristic;
   means for changing said first gain characteristic in response to said first output node;
   means for changing said second gain characteristic in response to said second output node;
   a first switching means for increasing the voltage differential between the first output node and the second output node, wherein said first switching means is connected to said first output node and controlled by said second inverter output; and
   a second switching means for increasing the voltage differential between the first output node and the second output node, wherein said second switching means is connected to said second output node and controlled by said first inverter output.

2. The circuit of claim 1, further comprising a means for equalizing said first gain characteristic and said second gain characteristic.

3. The circuit of claim 2, wherein said means for equalizing also equalizes said first inverter output and said second inverter output.

4. The circuit of claim 3 wherein the first inverter is a first NMOS inverter having a first bias signal and the second inverter is a second NMOS inverter having a second bias signal.

5. The circuit of claim 4 wherein the means for changing said first gain characteristic in response to said first output node is changing said first bias signal and the means for changing said second gain characteristic in response to said second output node is changing said second bias signal.

6. The circuit of claim 5, wherein said first switching means is a first MOS transistor and said second switching means is a second MOS transistor.

7. The circuit of claim 6, wherein said first shield impedance is a MOS transistor and said second shield impedance is a MOS transistor.

8. The circuit of claim 7, wherein said means for equalizing said first inverter output and said second inverter output is a MOS transistor connected between said first inverter output and said second inverter output.

* * * * *